(12) United States Patent
Kondo et al.

(10) Patent No.: US 6,271,149 B1
(45) Date of Patent: Aug. 7, 2001

(54) METHOD OF FORMING A THIN FILM ON A SUBSTRATE OF A SEMICONDUCTOR DEVICE

(75) Inventors: Masataka Kondo, Kobe; Katsuhiko Hayashi, Shiga; Eiji Kuribe, Osaka, all of (JP)

(73) Assignee: Kaneka Corporation, Osaka (JP)

(*) Notice: Subject to any disclaimer, the term of this patent is extended or adjusted under 35 U.S.C. 154(b) by 0 days.

(21) Appl. No.: 09/531,549

(22) Filed: Mar. 20, 2000

(30) Foreign Application Priority Data

May 20, 1999 (JP) ................................ 11-139820
Aug. 12, 1999 (JP) ................................ 11-228521
Sep. 30, 1999 (JP) ................................ 11-280266

(51) Int. Cl.[7] .................................................. H01L 21/31
(52) U.S. Cl. ........................ 438/758; 438/758; 430/127
(58) Field of Search ................................ 438/758, 759, 438/778, 779, 780, 782; 430/127, 128

(56) References Cited

U.S. PATENT DOCUMENTS 5,501,744 * 3/1996 Albright et al. ................ 136/258
5,587,226 * 12/1996 Leung et al. .................... 428/210
6,103,442 * 8/2000 Katagiri et al. ................. 430/127

FOREIGN PATENT DOCUMENTS 10-209477  8/1998 (JP).

* cited by examiner

Primary Examiner—David Nelms
Assistant Examiner—Dung Le
(74) Attorney, Agent, or Firm—Hogan & Hartson, LLP

(57) ABSTRACT

A method of manufacturing a semiconductor device having a substrate with a thin film formed thereon, the method including washing the substrate with a washing liquid, removing the washing liquid from the substrate by blowing a compressed air to the substrate washed, and forming a thin film on the substrate immediately after blowing the compressed air on the substrate without performed another step, wherein the compressed air to be blown on the substrate may be pre-heated or ionized and the substrate may be washed with an inert gas in the form of plasma before the thin film is formed.

14 Claims, 6 Drawing Sheets

METHOD OF FORMING A THIN FILM ON A SUBSTRATE OF A SEMICONDUCTOR DEVICE

CROSS-REFERENCE TO RELATED APPLICATIONS

This application is based upon and claims the benefit of priority from the prior Japanese Patent Applications No. 11-139820, filed May 20, 1999; No. 11-228521, filed Aug. 12, 1999; and No. 11-280266, filed Sep. 30, 1999, the entire contents of which are incorporated herein by reference.

BACKGROUND OF THE INVENTION

The present invention relates to a method and apparatus for manufacturing a semiconductor device made by forming a thin film on a substrate, such as a thin-film photovoltaic module.

To manufacture a thin-film photovoltaic module, for example, a thin film such as a semiconductor film or a metal film is formed on a substrate made of glass and having a transparent electrode formed on it.

When the thin film is formed on the substrate, particles may be attached to the substrate. If this happens, defects will develop. Therefore, the substrate is usually washed before the thin film is formed on the substrate in order to remove the particles.

When the washed substrate is left to stand and is thereby dried, the washing liquid attached to the substrate may form a water mark (stain). The substrate is therefore forcibly dried after the washing.

To dry the washed substrate, a clean oven is used in a conventional method. The clean oven is designed such that clean air is introduced into the interior. In the clean oven, the air is heated by a heater and circulated.

Therefore, if the washed substrate is placed in the clean oven, it can be dried with the heated air circulating in the clean oven.

As indicated above, the clean oven is designed to dry the substrate while the heated air is circulated, oven is clean, hence, the air gradually contain with particles remaining in the clean oven even if it is clean when introduced into the clean oven.

It is therefore easy for particles to attach to the substrate dried in the clean oven. Consequently, defects are likely to develop in the thin film formed on the substrate.

BRIEF SUMMARY OF THE INVENTION

An object of the present invention is to provide a method and apparatus for manufacturing a semiconductor device, characterized in that a washed substrate is free of contamination while it is being dried.

To achieve the object, a method of manufacturing a semiconductor device, wherein a thin film is formed on a substrate, comprises the steps of:

(a) washing the substrate with a washing liquid;

(b) removing the washing liquid from the substrate by blowing a compressed air to the substrate washed; and (c) forming a thin film on the substrate immediately after the step (b), without performing to another step.

In the method, the substrate is dried with clean air by blowing compressed air to the substrate. Contamination of the substrate can be prevented in the drying process.

Other objects and advantages of the present invention will become apparent from a consideration of the following Detailed Description of the Invention. The objects and advantages of the present invention can be attained by the constitutions clearly set forth in the accompanying claims or combination of the constitutions.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described with reference to the accompanying drawings.

Figure 1:
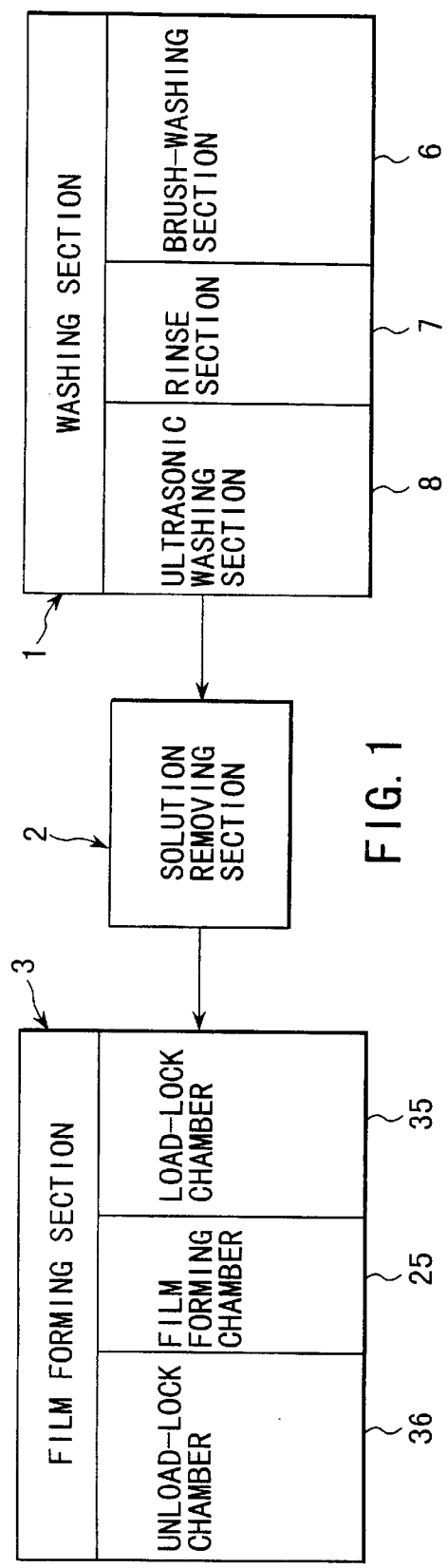
FIG. 1 is a view showing an apparatus for manufacturing a semiconductor device, according to a first embodiment of the present invention.

FIG. 1 shows an apparatus of manufacturing a semiconductor device, which is the first embodiment of the invention. The apparatus has a washing section 1, a liquid-removing section 2, and a film forming section 3.

Figure 2:
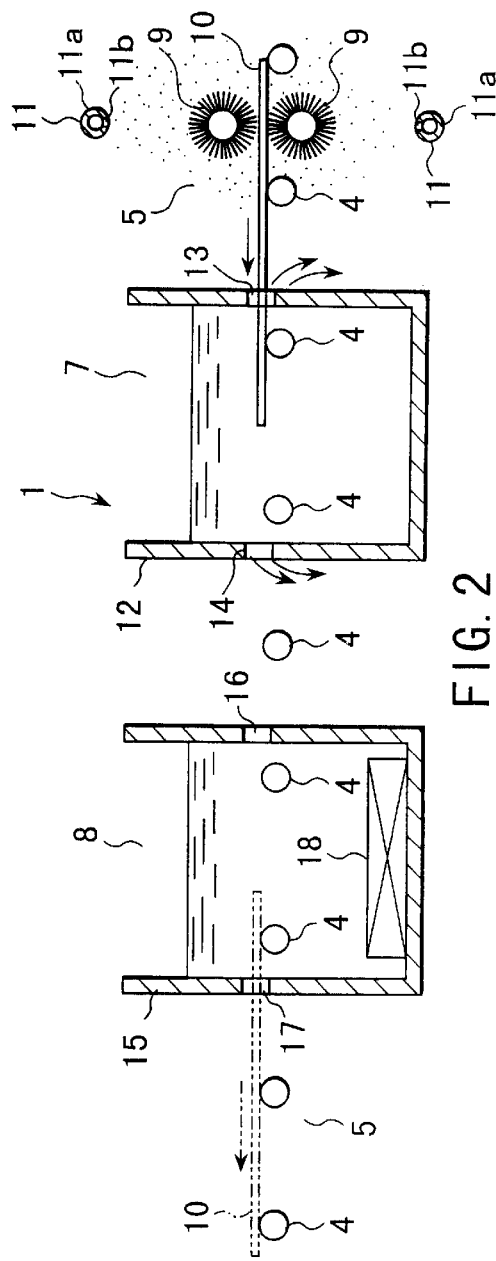
FIG. 2 is a schematic view showing the washing section of the apparatus.
Figure 3:
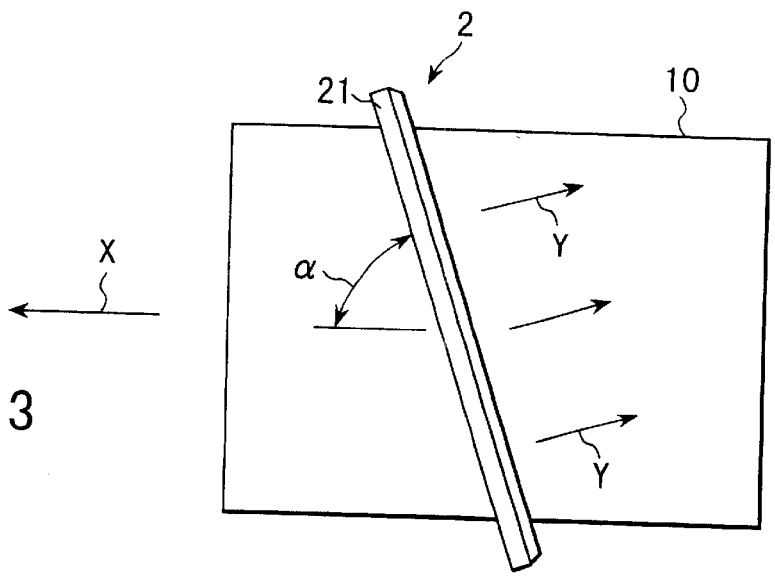
FIG. 3 is a schematic plan view of the liquid removing section of the apparatus.
Figure 4:
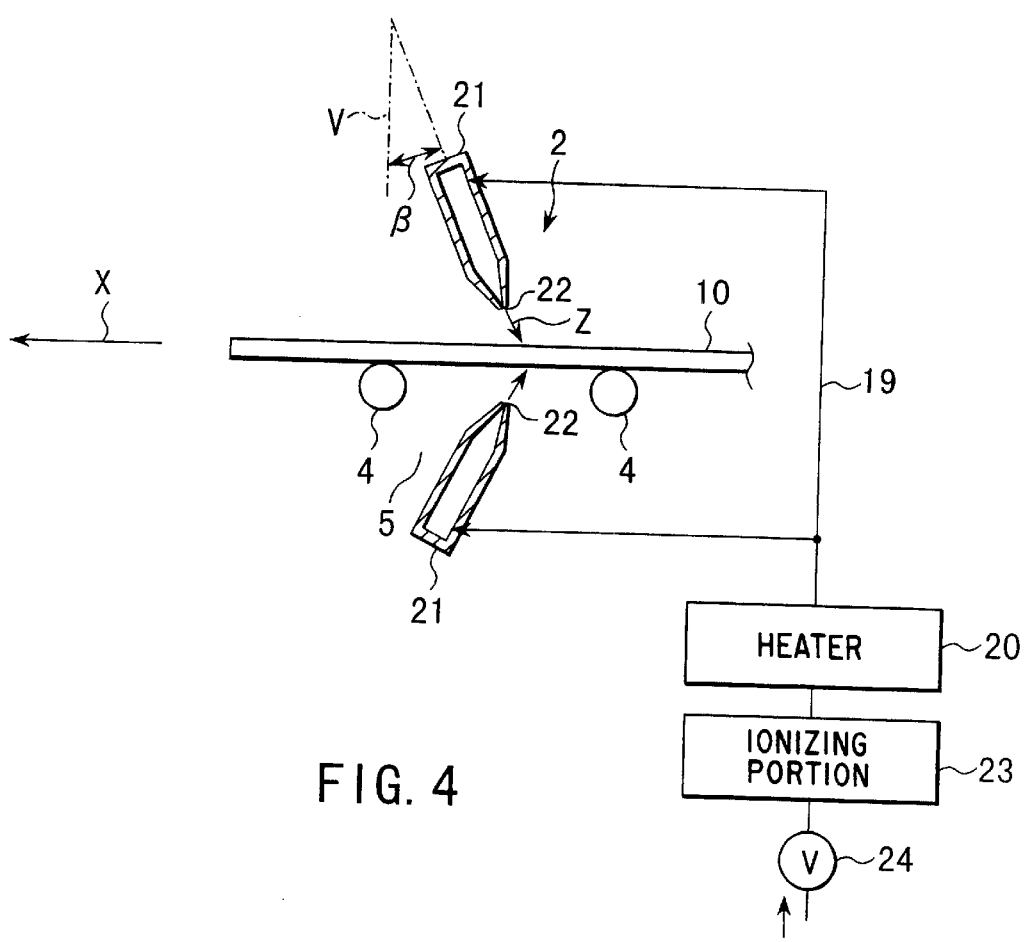
FIG. 4 is a side view of the liquid removing section.

The washing section 1 is designed to wash a glass substrate 10 having a transparent conducting film formed thereon and used as an electrode film, as shown in FIGS. 2, 3 and 4. The substrate 10 is a component of a semiconductor device, more precisely a thin film type photovoltaic module. The substrate is washed in the washing section 1 and dried in the liquid removing-section 2. Thereafter, a thin film, such as a semiconductor film or a metal film, is formed on that surface of the substrate on which an electrode film is provided (hereinafter, referred to as "upper surface"), in the film forming section 3.

As shown in FIGS. 2 and 3, a transfer mechanism 5 is provided in the washing section 1 and the liquid removing-section 2. The transfer mechanism 5 comprises a plurality of transfer rollers 4. The transfer mechanism 5 transfers the substrate 10 from the washing section 1 to the liquid removing section 2.

As shown in FIG. 1, the washing section 1 comprises a brush washing section 6, a rinse section 7, and an ultrasonic washing section 8. The sections 6, 7, and 8 are arranged in the direction of transferring the substrate 10.

The brush washing section 6 has a pair of washing brushes 9 and a nozzle body 11. The brushes 9 in contact the upper and lower surfaces of the substrate 10, respectively, which is to be transferred by the transfer roller 4. The nozzle body 11 supplies washing liquid such as detergent or pure water to a position where the washing brushes 9 contact the substrate 10. The upper surface of the substrate 10 is brush-washed with the washing liquid.

The nozzle body 11 is a tube 11a longer than the width of the substrate 10. The tube 11a has a plurality of nozzle holes 11b arranged at predetermined intervals.

In this embodiment, the washing liquid is supplied by the nozzle body 11 to only both upper and lower surfaces of the substrate 10 on which the thin film is to be formed. Nevertheless, the nozzle body 11 may be located only above the substrate 10 to wash the upper surface only.

The rinse section 7 has a rinse vessel 12. The rinse vessel 12 has a loading port 13 and an unloading port 14, the loading port 13 is made in the side wall positioned at the upstream of the transfer path of the substrate 10. The unloading port 14 is made in the opposite side wall positioned at the downstream of the transfer path. The loading port 13 and the unloading port 14 are formed at almost the same level as that of the substrate 10 to be transferred by the transfer roller 4.

Within the rinse vessel 12, the transfer roller 4 constituting the transfer mechanism 5 is arranged at the same level as that of the transfer roller 4 arranged outside. The mechanism 5 can transfer the substrate 10 through the loading port 13 into the rinse vessel 12 and from the vessel 12 through the unloading port 14, as shown by arrows in FIGS. 1 and 2.

Into the rinse vessel 12 rinse liquid such as pure water is supplied by the supply nozzle (not shown). The rinse liquid flows out of the rinse vessel 12 through the loading port 13 and the unloading port 14. The rinse liquid is supplies into the rinse vessel 12 at a rate equal to or slightly higher than the rate at which the liquid blows out through the loading port 13 and the unloading port 14.

With this mechanism, the surface of the rinse liquid in the rinse vessel 12 can be maintained at a higher level than the substrate 10. Thus, the substrate 10 is transferred in the rinse liquid. Therefore, the upper surface of the substrate 10 passing through the rinse vessel 12 is rinsed with the rinse liquid without fail. Furthermore, the particles washed out from the substrate 10 by the rinse treatment are rarely left in the rinse vessel 12. This is because the rinse liquid is always allowed to flow out from the loading port 13 and the unloading port 14.

In this embodiment, a single rinse vessel is used. Nevertheless, a plurality of rinse vessels may be arranged in the transfer direction of the substrate 10 to rinse more reliably the substrate 10 washed with the washing liquid.

The substrate 10 rinsed in the vessel 12 is washed in the ultrasonic washing section 8 having a washing vessel 15. The washing vessel 15 has a loading port 16 made in the side wall positioned at the upstream of the transfer path of the substrate 10. The vessel 15 has an unloading port 17 made in the opposite side wall positioned at the downstream of the transfer path. Both ports 16 and 17 are at substantially the same level as the substrate 10 to be transferred.

Inside the washing vessel 15, the transfer rollers 4 are arranged in the same manner as in the rinse vessel 12. An ultrasonic generator 18 for generating an ultrasonic vibration of about 20–40 kHz is provided at the bottom portion. Pure water is supplied into the washing vessel 15 as the washing liquid. The ultrasonic vibration generated by the ultrasonic wave generator 18 is applied to the washing liquid.

The rate of supplying the washing liquid is almost equal to or slightly larger than the rate at which the liquid flows out through the loading port 16 and unloading port 17. As mentioned above, the surface of the washing liquid in the washing vessel 15 is slightly higher than the upper surface of the substrate 10 to be transferred by the transfer rollers 4. Therefore, both upper and lower surfaces of the substrate 10 can be washed by the washing liquid vibrated by the ultrasonic wave.

In addition, since a part of the washing liquid flows from the loading port 16 and the unloading port 17, the particles removed from the substrate 10 by the ultrasonic washing can to flow out, too.

The substrate 10 washed in the ultrasonic washing section 8 is dried in the liquid-removing section 2 shown in FIGS. 3 and 4. The solution-removing section 2 is constituted of a pair of air knives 21 which face the upper and lower surfaces of the substrate to be transferred. To the air knife 21, compressed air cleaned by a filter is applied through a pipe 19.

Onto the pipe 19, there are provided a heater 20 for heating the compressed air and an ionizing portion 23 for ionizing the compressed air. Note the compressed air is set at a pressure of about 5 kg/cm$^2$ by a pressure control valve 24 attached to the pipe 19. The air knives 21 are longer than the width of the substrate 10. As shown in FIGS. 3 and 4, each air knife 21 has a slit 22 extending along almost all length of the knife and opening at an edge thereof. The slits 22 of the air knives 21 face the upper or lower surface of the substrate 10, respectively.

Each air knife 21 is inclined at a predetermined angle a to the transfer direction X of the substrate. The compressed air is applied through the slit 22 in a direction Z inclined at an angle β to the direction V perpendicular to the transfer direction X, as shown in FIG. 3.

The compressed the air applied to each air knife 21 is blown toward the upper or lower surface of the substrate 10 from the slit hole 22. The washing liquid on the upper and lower surfaces of the substrate 10 is thereby pushed toward the rear edge of the substrate 10 in the transfer direction of the substrate, as indicated by an arrow Y in FIG. 3. As a result, the washing liquid falls dropwise and smoothly from the end of the substrate. Thus, the washing liquid is removed from the substrate 10.

The compressed air to apply to the air knife is heated by the heater 20 to a temperature higher than room temperature, for example, to about 40–50° C. Therefore, the washing liquid is removed from the substrate 10 by force of the compressed air, and the substrate 10 is dried with heat of the compressed air. Therefore, the substrate 10 can be efficiently dried without fail.

Even if the compressed air is not heated, the substrate can be dried to a predetermined degree. On the other hand, if the compressed air is ionized and applied to the substrate 10, the substrate 10 can be prevented from being electrically charged during the drying process. As a result, no static electricity will be generated, no particles will be attached to the substrate 10. Hence, the substrate 10 is not contaminated during the drying process.

The substrate 10 dried in the solution-removing section 2 is immediately transferred to the film forming section 3.

More specifically, the substrate 10 is unloaded by the transfer rollers 4 and transferred to the film forming section 3 by a robot (not shown). In other words, the substrate 10, from which the washing liquid has been removed, is directly transferred to the film forming section 3 without being subjected to any other process.

The substrate 10 dried in the liquid removing section 2 and unloaded therefrom is continuously loaded into the film forming section 3. Therefore, the chance for the particles in the atmosphere to attach to the dried substrate 10 are small. The substrate 10 is transferred to the film forming process 3, while kept clean.

Furthermore, the substrate 10 is dried with the compressed air, not in a clean oven as in the conventional method. The drying process can therefore be performed immediately after the washing process.

Therefore, unlike the case where the washed substrates 10 are dried in batches in a clean oven, the time elapsing between the washing process and the drying process can be reduced. It is therefore possible to prevent the washing liquid applied to the substrate 10 during the washing process, from partially being dried before the dry process to make a water mark (stain) onto the substrate 10.

Figure 5:
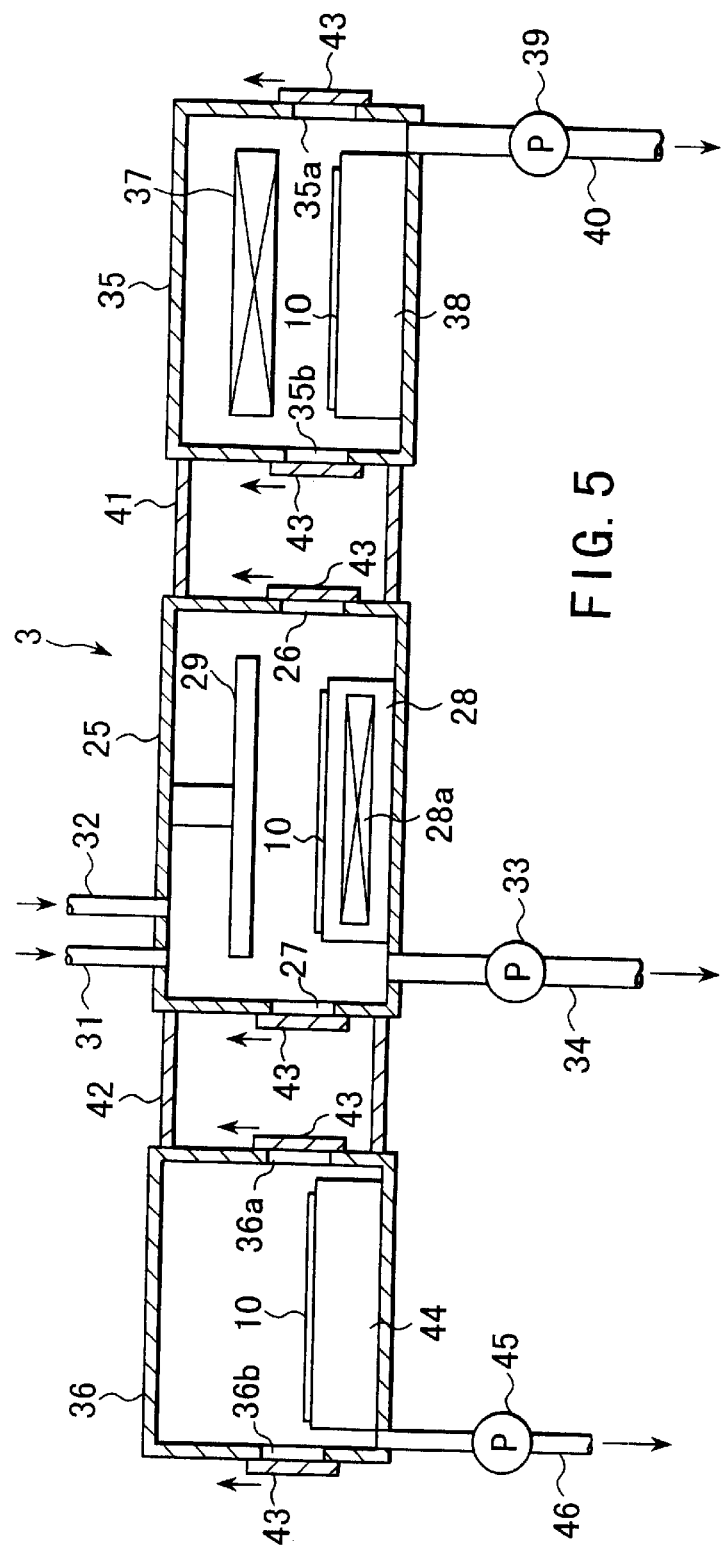
FIG. 5 is a schematic view of the film forming section of the apparatus.

The film forming section 3 has a film forming chamber 25 as shown in FIG. 5. The film forming chamber 25 is used for forming a thin film on the upper surface of the substrate 10 by a plasma process (CVD). The film forming chamber 25 has a loading port 26 in one side and an unloading port 27 in the opposite side. Provided in the film forming chamber 25 are a table 28 and a high frequency electrode 29. The table 28 incorporates a heater 28a. The electrode 29 is arranged, facing the upper surface of the table 28.

Furthermore, two supply pipes 31 and 32 are connected to the upper portion of the film forming chamber 25. The first supply pipe 31 is used to supplies material gas. The second supply pipe 32 is provided for supplying an inert gas into the film formation chamber 25. To the bottom of the chamber 25, an exhaust pipe 34 having a vacuum pump 33 is connected.

At the loading port 26 of the film forming chamber 25, a load-lock chamber 35 is arranged. At the unloading port 27 of the chamber 25, an unload-lock chamber 36 is arranged. The chambers 35 and 36 have loading ports 35a and 36a and unloading ports 35b and 36b, respectively.

A pre-heater 37 and a support table 38 are arranged in the load-lock chamber 35. An exhaust duct 40 having a vacuum pump 39 is connected to the bottom of the load-lock chamber 35.

The unloading port 35b of the load-lock chamber 35 and the loading port 26 of the film forming chamber 25 are connected airtight by a first connecting body 41. The unloading port 27 of the film forming chamber 25 and the loading port 36 of the unload-lock chamber 36 are connected airtight by way of a second connection body 42.

The loading ports and the unloading ports of the chambers 25, 35 and 36 are closed airtight by valves 43. The first and second connecting bodies 41 and 42 incorporate transfer robots (not shown). Furthermore, a mounting table 44 is arranged in the unload-lock chamber 36. An exhaust duct 46 having an vacuum pump 45 is connected to the bottom of the chamber 36.

When the substrate 10 dried in the liquid removing section 2 is placed on the support table 38 in the load-lock chamber 35, the loading port 35a is closed and the load-lock chamber 35 is depressurized. Simultaneously, the substrate 10 is pre-heated by the pre-heater 37. During the preheating, the load-lock chamber 38 is depressurized by the vacuum pump 39.

When the substrate 10 is pre-heated, the loading port 35a of the load-lock chamber 38 is closed and the unloading port 35b is opened. Subsequently, the robot arranged in the first connecting body 41 enters the load-lock chamber 35 and receives the substrate 10 from the holding table 38.

At the same time, the unloading port 35b of the load-lock chamber 35 is closed airtight by the valve 43. Simultaneously, the loading port 26 of the film forming chamber 25 is opened. The substrate 10 preheated is placed onto the table 28 in the film forming chamber 25 by the robot arranged in the first connection body 41. Then, the robot moves back. Thereafter, the loading port 26 is closed, and the film formation chamber is depressurized by the vacuum pump 33.

When the film forming chamber 25 is depressurized to a predetermined pressure, an inert gas is supplied from the second supply pipe 32 into the chamber 25. Simultaneously, high frequency power is supplied to a high frequency electrode 29, activating the inert gas. The gas activated has a cleaning function. The substrate 10 washed in the washing section 1 is therefore further cleaned with the inert gas.

When the substrate 10 is cleaned with the inert gas for a predetermined time, material gas is supplied, in place of the insert gas, from the first supply pipe 31 into the film forming chamber 25. The material gas is reacted in a plasma generated by supplying a high frequency power to the high frequency electrode 29.

As a result, a solid substance generated in the reaction is deposited on the upper surface of the substrate 10, forming a thin film on the upper surface of the substrate 10.

The substrate 10 is washed in the washing section 1 and then transferred to the solution-removing section 2, in which the substrate 10 is dried without contamination. Thereafter, the substrate 10 is transferred to the film forming chamber 25.

Since no particles are contained in the thin film deposited on the substrate 10, it is possible to prevent defects from developing in the thin film. As a result, the semiconductor device can be manufactured in a high yield.

In the case of a photovoltaic module having 50 cells connected in series, manufactured by employing the clean oven in a conventional drying process of the substrate 10, 40 cells are defective as experiments shows. In the case of the photovoltaic module according to the present invention wherein the substrate 10 has been dried with the compressed air, defects were developed in only 10 or less cells.

To detect whether or not a cell has defects, a reverse voltage is applied to the cell. If the particles are contained in the film during the film forming process, they cause a short circuit. Whether defects have developed or not can be determined in accordance with whether the applied voltage changes or not.

When the film formation on the substrate 10 is completed, the unloading port 27 of the film forming chamber 25 is opened, and a robot moves from the second connecting body 42 and enters the film forming chamber 25 and receives the substrate 10. Simultaneously, the loading port 36a of the unload-lock chamber 36 is opened.

The robot loads the substrate 10, on which a film is formed in the film forming chamber 25, into the unload-lock chamber 36 and mounts it on a mounting table 44. Thereafter, the robot moves back to the second connecting body 42. Simultaneously, the unloading port 27 of the film forming chamber 25 and the loading port 36a of the load-lock chamber 36 are closed.

In this embodiment, the load-lock chamber 35 and unload-lock chamber 36 are connected airtight at the loading port 26 and the unloading port 27 of the film forming chamber 25, respectively. By virtue of this structural feature, the substrate 10 can be transferred without significantly degrading the depressurized state of the film forming chamber 25.

The substrate 10 mounted on the mounting table 44 of the unload-lock chamber 36 is taken out by a robot (not shown) placed outside the unloading port 43 of the chamber 36. The substrate 10 is then subjected to the next process.

The present invention is not limited to the aforementioned embodiment. For example, a single brush washing unit, a single rinse unit and a single ultrasonic washing unit, all used in the washing section in the aforementioned embodiment, however, may each be replaced by a plurality of units. Further, the three types of washing units used in combination may be replaced by one or two types of washing units.

A nozzle washing unit for applying the ultrasonically vibrated washing liquid from the nozzle to the substrate may be combined with the aforementioned washing units or may be used alone.

A single load-lock chamber for preheating the substrate and maintaining the reduced pressure state of the film formation chamber is placed at the upstream of the film formation chamber in the film forming section. Nonetheless, a plurality of load-lock chambers may be used to perform a series of processes on the substrate continuously, without waiting time, if the efficiency in preheating the substrate is improved and if each of the periods required for the washing section and the liquid removing section is equal to the period required to form the film formation in the film forming section.

The semiconductor device of the present invention is not limited to a photovoltaic module. Rather, it may be a liquid crystal display panel and a semiconductor wafer. In short, the present invention can be applied to any case where a thin film is formed on the substrate.

Figure 6:
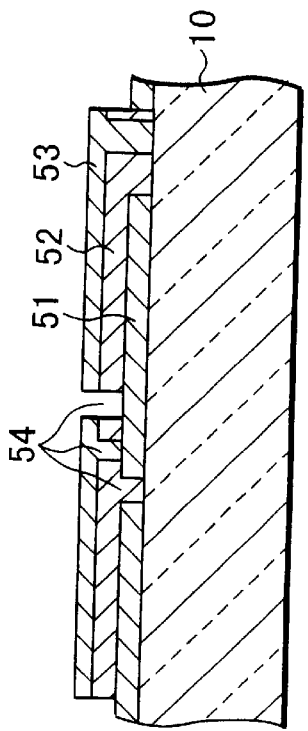
FIG. 6 is a cross sectional view of the substrate having a thin film subjected to scribing.

In the film forming section 3 shown in FIG. 1, a transparent conducting film 51, a semiconductor film 52 for use in photovoltaic conversion, and a rear surface electrode film 53 are stacked on upon another, on the substrate 10 as shown in FIG. 6. When these films are stacked, each of the films are scribed as is indicated by a scribe line 54 in the figure. The scribe lines are formed by a laser beam.

When the thin film is scribed with the leaser beam, particles of debris are generated. The particles are attached to the substrate 10 and remain thereon. The particles remaining on the substrate 10 sometimes cause defects in the thin film formed next thereon.

It is necessary to wash the substrate 10 after the transparent conducting film 51 is formed and scribed, after the semiconductor film 52 is formed on the transparent conducting film 51 and scribed, and after the rear surface electrode 53 is formed and scribed.

Figure 7:
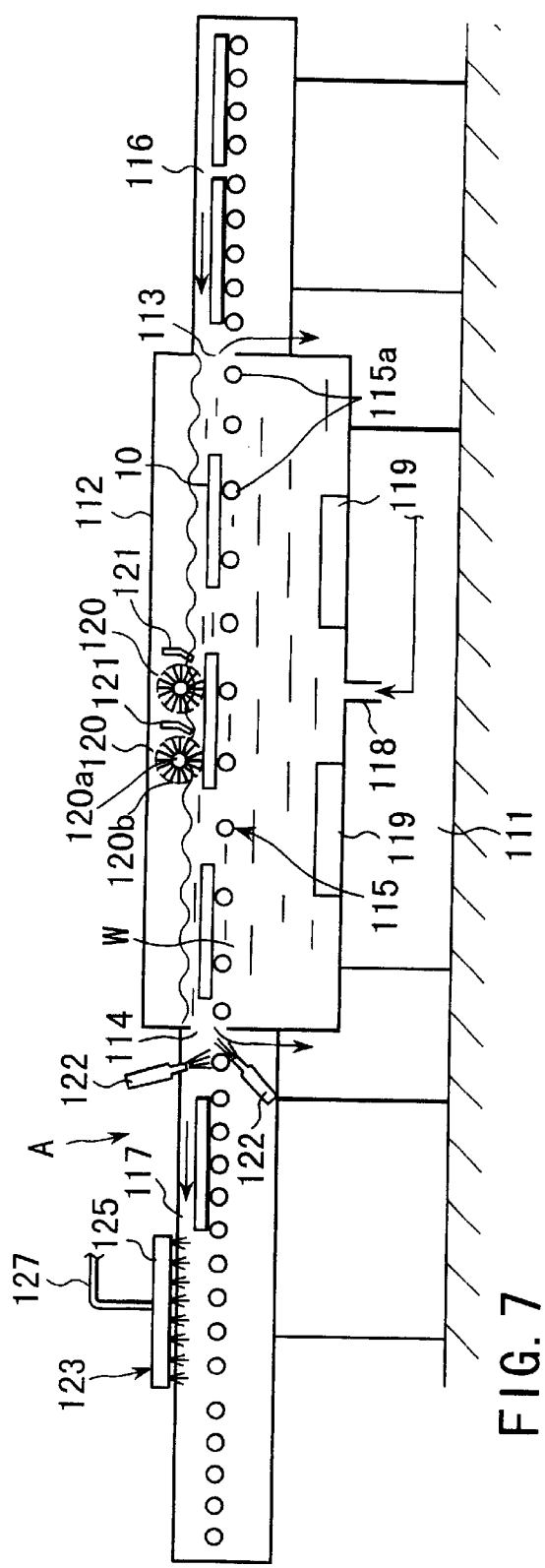
FIG. 7 is a schematic side view of a washing unit according to a second embodiment of the invention.
Figure 8:
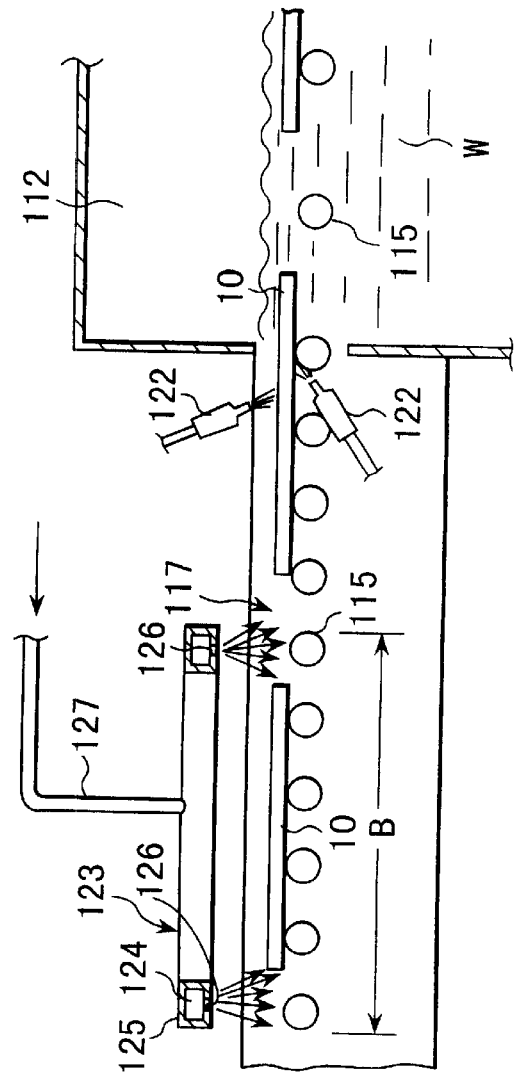
FIG. 8 is an enlarged view of part A of FIG. 7.
Figure 9:
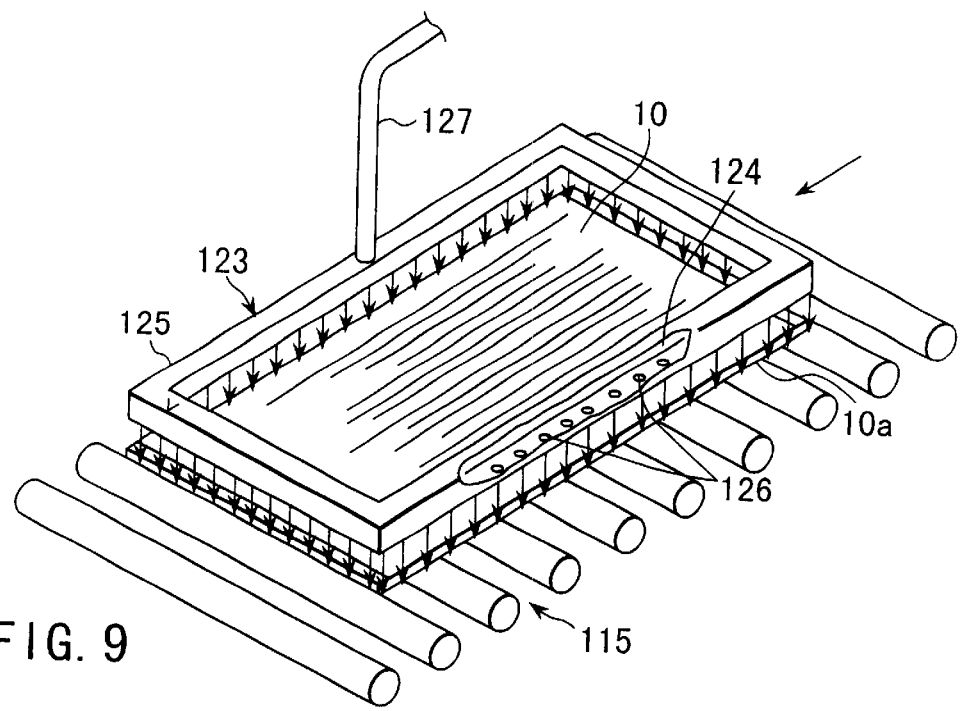
FIG. 9 is a schematic perspective view of the air blower mechanism of the washing unit.

FIGS. 7 to 9 show a second embodiment of the present invention. This embodiment is a washing unit for washing the substrate 10 after the transparent conducting film 51 is formed on the substrate 10 and scribed, after the semiconductor film 52 for photovoltaic conversion is formed and scribed, and the rear surface electrode film 53 is formed and scribed.

Now, the washing unit will be explained. FIG. 7 is a schematic vertical longitudinal sectional view of the washing unit for the substrate 10 for a photovoltaic module. FIG. 8 is an enlarged sectional view of portion A of FIG. 7. FIG. 9 is a perspective view of an air blower mechanism.

The washing unit for washing the substrate 10 has a base 111. A washing vessel 112 is provided on the base 111. A loading port 113 for the substrate 10 is made in the side wall at one of the washing vessel 112. The wall at the other end has an unloading port 114. A roller conveyer 115 is provided as a transfer mechanism, both inside and outside the washing vessel 112 at the substantially the same level as the loading port 113 and the unloading port 114. The roller conveyer 115 transports the substrate 10 horizontally. While the substrate 10 is being so transported, its surface, on which a transparent electrode 51 is formed, remains turned upward.

The rollers 115a constituting the roller conveyer 115 are rotated by a rotation-drive mechanism (not shown). With this rotation, the substrate 10 is loaded into the washing vessel 112 through the loading port 113 and unloaded through the unloading port 114.

A loading section 116 is provided at the loading port 113 of the washing vessel 112, for loading the substrate 10 unwashed. An unloading section 117 is provided at the unloading port 114, for unloading the substrate 10 washed. The roller conveyer 115 extends from the loading section 116 to the unloading section 117.

The bottom of the washing vessel 112 has a pure water supply port 118 for supplying, for example, pure water W. The pure water port 118 is connected to a pure water source (not shown). Furthermore, an ultrasonic oscillator 119 (output 0.2 to 1.0 W/cm$^2$) is provided on the inner bottom of the washing vessel 112.

A plurality of rotating brushes 120 and high-pressure air nozzles 121 are arranged above the roller conveyer 115. The rotation brush 120 comprises a rotation shaft 120a rotated by the rotation drive mechanism (not shown) and a nylon bristle 120b planted around the rotation shaft 120a and configured in the roll form. The rotation brush 120 is provided for removing particles such as debris and burr remaining inside the scribe line 54, by rubbing the substrate 10 and the scribe line 54 with the tip of the bristle 120b onto. To the portion rubbed and scribed by the rotation brush 120, high-pressure air is applied from the high pressure air nozzle 121, thereby blowing the particles away.

Furthermore, an air knife 122 is provided at the unloading port 114 of the washing vessel 112, for blowing pure water W and particles from the upper and lower surfaces of the substrate 10.

Note that the purity of the water present in the pure water supply source or at an output port of a pure water producing unit is as follows:

Resistivity: 16–18 MΩ·cm (25° C.)

The number of fine particles of 0.2 μm or more: 100–150/ml

The number of viable bacteria: 0–10/ml

Organic material: 0.5 to 1.0 ppm.

As shown in FIGS. 8 and 9, an air blower mechanism 123 is provided in the unloading section 117 of the washing vessel 112, for blowing a high pressure air to an outer peripheral portion 10a of the substrate 10 to be transferred by the roller conveyer 115.

The air blower mechanism 123 has a nozzle main body 125. The body 125 has the same rectangular frame form as the outer peripheral portion 10a of the substrate 10 and has an air passage 124 inside. The lower surface of the nozzle main body 125 has a plurality of nozzle holes 126 for spraying high pressure air to the outer peripheral portion 10a of the substrate 10.

The air blower mechanism 123 is provided above the substrate 10 placed on the roller conveyer 115. The air passage 124 is connected to a high pressure air source (not shown) by the air supply pipe 127.

How the substrate 10 is washed by the washing apparatus mentioned above will be described. Pure water W is supplied via the pure water supply port 118 to the washing vessel 112. When the pure water W reaches the level of the loading port 113 and the unloading port 114, it water W starts flowing out through the loading port 113 and the unloading port 114. Therefore, the level of the pure water W in the washing vessel 112 remains constant. When power is supplied to the ultrasonic oscillator 119, ultrasonic vibration is transmitted to the pure water W.

When the substrate 10 is mounted on the roller conveyer 115 of the unloading section 116, the substrate 10 is transferred toward the loading port 113. When the substrate 10 is moved into the pure water W of the washing vessel 112 by the roller conveyer 115, particles such as debris and burr are removed from the scribe line 54 of the substrate 10. This is because the pure water W is ultrasonically vibrated. The particles removed are discharged along with the flowing-out water or precipitated in the pure water W. Therefore, no particles are attached again to the substrate 10. It is therefore possible to effectively reduce the contamination of the washing vessel 112 with particles.

The substrate 10 is washed while being transferred. Therefore, a plurality of substrates 10 are continuously washed. Furthermore, the entire surface of the substrate can be uniformly and ultrasonically vibrated since the substrate 10 moves above the ultrasonic oscillator 119.

The washed substrate 10 is unloaded from the unloading port 114 of the washing vessel 112 to the unloading section 117. The pure water W and the particles are removed from the upper and the lower surfaces of the substrate 10 unloaded from the unloading port 114 as the high pressure air is blown from the air knife 122. The substrate 10 can be continuously washed and dried.

When the substrate 10 washed is conveyed to the unloading section 117 by the roller conveyer 115, high pressure air is blown to the substrate 10 from the blow nozzle holes 126 of the air blow mechanism 123. The nozzle main body 125 has the same rectangular frame form as the outer peripheral portion of the substrate 10.

Since the high pressure air is strongly blown to the periphery 10a of the substrate 10, the water drops can be removed from the outer periphery 10a of the substrate 10, i.e., four sides thereof.

The high pressure air can be blown to the periphery 10a of the substrate 10, while the substrate 10 is being transferred by the roller conveyer 115. When the substrate 10 faces the air blower mechanism 123, the roller conveyer 115 is stopped in a stop B zone shown in FIG. 8. The high pressure air can therefore be intensively blown to the periphery 10a of the substrate 10.

Note that the air blower mechanism 123 (not shown) may be moved for a predetermined time in synchronism with the movement of the substrate 10 transferred by the roller conveyer 115.

Figure 10:
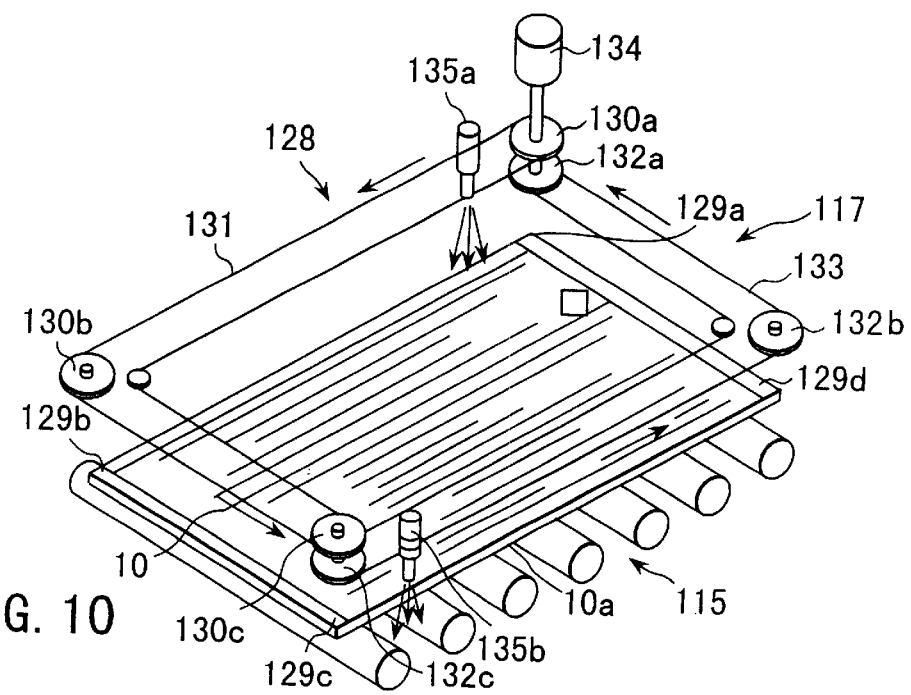
FIG. 10 is a schematic perspective view of an air blower mechanism according to a third embodiment of the invention.

FIG. 10 shows a modified example of the air blower mechanism 128 according to a third embodiment.

At the unloading section 117 of the washing vessel 112, upper-stage pulleys 130a, 130b, 130c are provided for a first corner portion 129a, a second corner portion 129b, and a third corner portion 129c, respectively. An upper-stage endless belt 131 is wrapped around these upper-stage pulleys 130a, 130b, 130c.

Lower-stage pulleys 132a, 132b, 132c are provided respectively at the portions facing the first corner portion 129a, a fourth corner portion 129d and the third corner portion 129c. A lower-stage endless belt 133 is wrapped around the lower-stage pulleys 132a, 132b, 132c.

The upper-stage pulley 130a and the lower-stage pulley 132a, which are provided at the first corner portion 129a, are supported coaxial with the upperstage pulley 130c and the lower stage pulley 132c which are provided at the third corner portion 129c. A motor 134 is connected to the shaft of the upper-stage pulley 130a and the lower-stage pulley 132a, both provided at the first corner portion 129a.

The air applying nozzles 135a and 135b are attached respectively to parts of the upper stage endless belt 131 and the lower stage endless belt 133. The air applying nozzles 135a and 135b are connected to a high pressure air supply source.

Since the air blower mechanism 128 is thus constructed, the upper-stage endless belt 131 and the lower-stage endless belt 133 are moved in the directions indicated by arrows, respectively, when the upper pulley 130a and the lower pulley 132a are rotated by the rotation of the motor 134.

Therefore, the air spray nozzle 135a moves along the two sides of the substrate 10, which define the second corner portion 129b of the substrate 10. The air applying nozzle 135b moves along the two sides of the substrate 10, which define the fourth corner portion 129d of the substrate 10. When a high-pressure air is blown from the air applying nozzles 135a and 135b, the high-pressure air is blown intensively toward the periphery 10a of the substrate 10, i.e., the four side surfaces thereof. It is therefore possible to blow water drops from the periphery 10a of the substrate 10.

The high pressure air is blown to the periphery 10a of the substrate (i.e., the four side surfaces thereof) while the substrate 10 is transferred by the roller conveyer 115. Alternatively, the air can be blown intensively to the periphery 10a of the substrate 10 by stopping the roller conveyer 115 at the stop zone B when the substrate 10 faces the air blower mechanism 123.

In the third embodiment, the air applying nozzles 135a and 135b are moved along the periphery 10a of the substrate 10 (i.e., the four side surfaces) by the pulleys and the endless belts. As the mechanism for driving the nozzles 135a and 135b, a ball-screw mechanism and a linear motor may be used. Nonetheless, the drive mechanism is not limited to this type.

In the second and third embodiments, the roller conveyer 115 is used to transport the substrate 10. The substrate may be transferred by a water-permeable endless belt made in the form of a mesh or a ladder.

The washing liquid is not limited to pure water W. Tap water or a chemical washing liquid may be used. The chemical washing liquid used may be water containing a detergent or organic solvent such as acetone, methanol, ethanol, trichloroethylene or Freon.

In the second and third embodiments shown in FIGS. 7 to 10, a substrate is washed which has, on one surface, a transparent conducting film with a scribe line formed by a laser beam. The substrate to be washed is not limited to this. The washing apparatuses according to the second and third embodiments can wash a substrate which has a semiconductor film and a rear surface electrode successively formed on a transparent conducting film and scribed by a laser beam.

The air blower mechanisms of the second and third embodiments may be arranged at downstream of the liquid removing section 2 of the first embodiment. With this arrangement, the washing liquid can be removed without fail even if the washing liquid remains on the periphery of the substrate after the substrate is dried in the liquid removing section 2.

Figure 11:
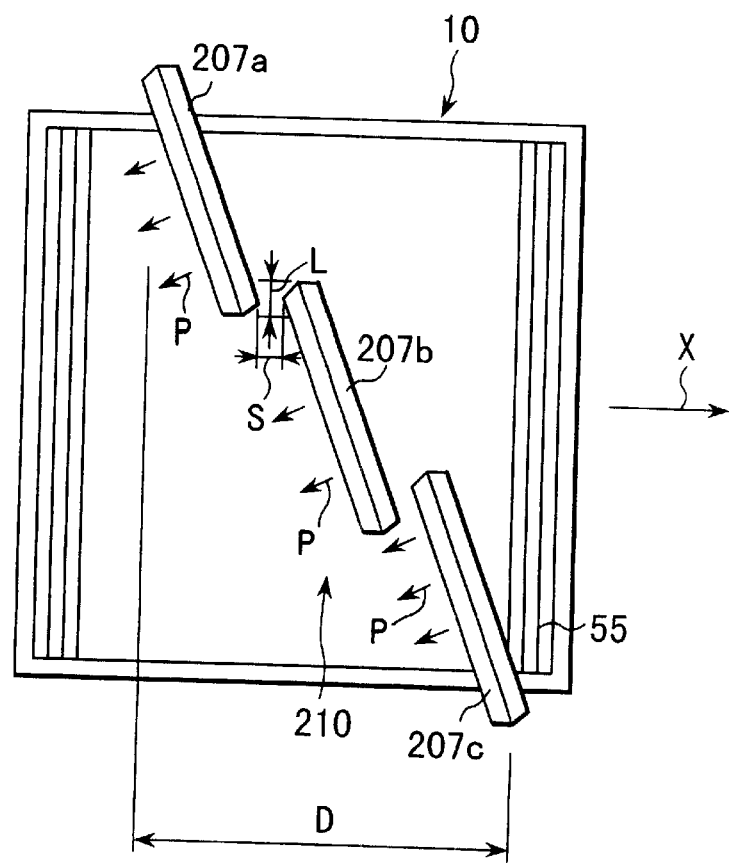
FIG. 11 is a plan view of a liquid removing section according to a fourth embodiment of the present invention.
Figure 12:
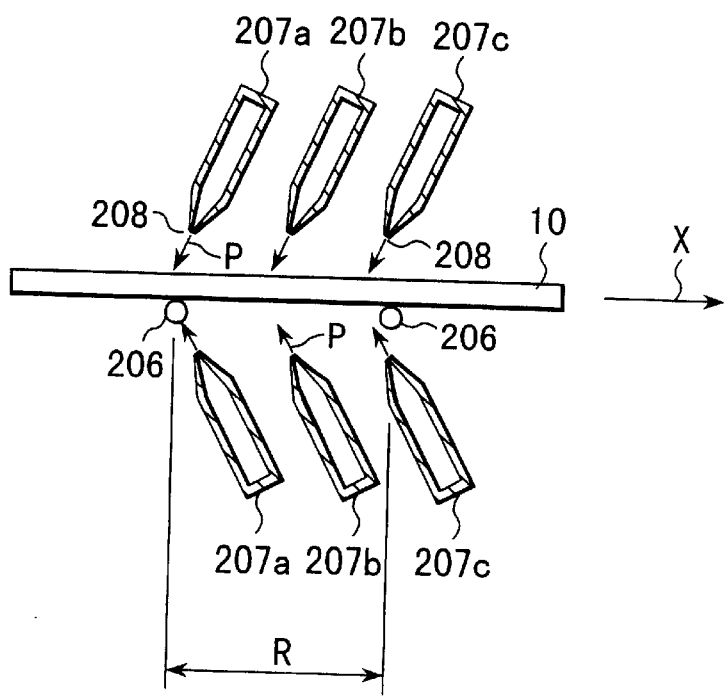
FIG. 12 is a side view of the liquid removing section.

FIGS. 11 and 12 show a liquid removing section 210 according to a fourth embodiment which can be used in place of the liquid removing section 2 of the first embodiment and the water removing air knife 122 of the second embodiment.

As shown in FIG. 11, the substrate 10 is washed, after the transparent conducting film 51, semiconductor film 52, or rear surface electrode film 53 is laser-scribed. The substrate 10 is transferred to the liquid removing section 210 by the transfer roller 206, with the scribe lines 55 (only some of the scribe lines are shown in FIG. 11) arranged perpendicular to the transfer direction indicated by an arrow X.

In the liquid removing section 210, three air knives 207a, 207b and 207c are arranged in the order mentioned, from the upper portion to the lower portion. The air knives incline to the direction perpendicular to the substrate transfer direction X. In other words, they cover the substrate 10 over the entire width thereof.

As shown in FIG. 11, the distance D from one end of the air knife 207a to the other end of the air knife 207c along the substrate transfer direction exceeds interval R of adjacent transfer rollers 206. Furthermore, the air knives incline more to the direction perpendicular to the substrate transfer than in the case where a single knife is used.

The adjacent air knives (207a and 207b, or 207b and 207c in FIG. 11) are arranged with their most close end portions spaced apart from each other in the substrate transfer direction and overlapping in the direction perpendicular to the substrate transfer direction. More specifically, as shown in FIG. 11, the lower end of the air knife 207a is spaced apart from the upper end of the air knife 207b at an interval S in the substrate transfer direction. Furthermore, the lower end of the air knife 207a and the upper end of the air knife 207b overlap as shown by symbol L in FIG. 11. Liquid is removed by blowing compressed air to the substrate 10 from the slit nozzles 208, each extending over entire length of air knives 207a, 207b and 207c in the direction indicated by an arrow P in FIG. 11.

In this embodiment, three air knives 207a, 207b and 207c are arranged in excess of the interval R between the adjacent transfer rollers 206 and greatly inclined to the direction perpendicular to the substrate transfer direction. Furthermore, the overlapping portion L extends in the direction perpendicular to the substrate transfer direction. With this arrangement, compressed air can be reliably blown to the region corresponding to the interval R of the transfer roller 206. Therefore, liquid can be removed from the substrate 10 sufficiently.

Since the air knife is greatly inclined, a sufficient force is generated to blow away the washing liquid from the substrate 10 in the direction perpendicular to the substrate transfer direction.

The washing liquid is first pushed away through grooves of the scribe lines 55 by the compressed air applied from the nozzle 208 of the air knife 207a. When the substrate 10 reaches the mid portion (interval S) between the air knife 207a and the air knife 207b along the substrate transfer direction, the compressed air is no longer applied to the washing liquid. The compressed air is not applied to the washing liquid for a short period of time, and no force is applied to the washing liquid for this period.

However, right before the washing liquid starts flowing reversely, the compressed air applied from the nozzle 208 of the air knife 207b blows the washing liquid through the grooves of the scribe lines 55. The liquid is blown in a similar manner by the air knives 207b and 207c.

When the compressed air is applied, the washing liquid forms waves in the grooves of the scribe lines 55. The waves are not so high. Therefore, when the waves become low in the middle region (interval S) between the air knives, not breaking or scattering, the washing liquid is made to flow again, by the compressed air blown from the next air knife. With this mechanism, the washing liquid is successfully removed from the substrate 10.

It is possible to improve the photovoltaic conversion efficiency of the photovoltaic module, because the waves of the particle-containing washing liquid do not break to wet the region from which water has been completely removed.

The photovoltaic modules manufactured by using the substrate 10 washed in the method according to this embodiment were tested for current/voltage characteristics by using 1.5 solar simulator (AM=1.5, 100 mM/cm$^2$). As a result, the fill factor (FF) was 67%. On the other hand, the photovoltaic module manufactured by using the substrate 10 washed by a conventional method had a fill factor (FF) of 65%. Hence, the washing method of this embodiment is effective in improving the photovoltaic conversion efficiency of the photovoltaic module.

"AM" used herein stands for "Air Mass," which indicates a solar spectrum, and more specifically, the thickness of the atmospheric layer through which a solar light passes. For example, AM is 0 in the space and 1 right at the equator.

"FF" used herein stands for "Fill Factor." The maximum value of V×I on the VI curve of a photovoltaic module is denoted by "Pmax." FF is a value obtained by dividing Pmax by a product of multiplying an open circuit voltage (Voc) and short circuit current (Ise).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device by forming a thin film on a substrate, comprising the steps of:
    (a) washing the substrate with a washing liquid;
    (b) removing the washing liquid from the substrate by blowing a compressed pre-heated air to the substrate washed; and
    (c) forming a thin film on the substrate immediately after the step (b), without performing another step .

2. The method according to claim 1, wherein the step (a) comprises the steps of:
    (a-i) washing the substrate with the washing liquid by use of a brush;
    (a-ii) rinsing the brush-washed substrate; and
    (a-iii) washing the rinsed substrate by using ultrasonic waves.

3. The method according to claim 1, wherein, in the step (b), the compressed air to be blown to the substrate is ionized.

4. The method according to claim 1, wherein the step (c) further comprises a step of heating the substrate before the thin film is formed on the substrate.

5. The method according to claim 1, wherein, the substrate from which the washing liquid has been removed in the step (b) is directly subjected to the step (c) for forming a thin film.

6. The method according to claim 1, wherein, in the step (c) the substrate is washed with an inert gas in the form of plasma before the thin film is formed.

7. A method of manufacturing a semiconductor device by forming a thin film on a substrate, comprising the steps of:
(a) washing the substrate with a washing liquid;
(b) removing the washing liquid from the substrate by blowing a compressed ionized air to the substrate washed; and
(c) forming a thin film on the substrate immediately after the step (b), without performing another step.

8. The method according to claim 7, wherein the step (a) comprises the following steps of:
(a-i) washing the substrate with the washing liquid by use of a brush;
(a-ii) rinsing the brush-washed substrate; and
(a-iii) washing the rinsed substrate by using ultrasonic waves.

9. The method according to claim 7, wherein the step (c) further comprises a step of heating the substrate before the thin film is formed on the substrate.

10. The method according to claim 7, wherein the substrate from which the washing liquid has been removed in the step (b) is directly subjected to the step (c) for forming a thin film.

11. A method of manufacturing a semiconductor device by forming a thin film on a substrate, comprising the steps of:
(a) washing the substrate with a washing liquid;
(b) washing the substrate with an inert gas in the form of plasma;
(c) removing the washing liquid from the substrate by blowing a compressed air to the substrate washed; and
(d) forming a thin film on the substrate immediately after the step (b), without performing another step.

12. The method according to claim 11, wherein the step (a) comprises the steps of:
(a-i) washing the substrate with the washing liquid by use of a brush;
(a-ii) rinsing the brush-washed substrate; and
(a-iii) washing the rinsed substrate by using ultrasonic waves.

13. The method according to claim 11, wherein the step (c) further comprises a step of heating the substrate before the thin film is formed on the substrate.

14. The method according to claim 11, wherein the substrate from which the washing liquid has been removed in the step (b) is directly subjected to the step (c) for forming a thin film.

* * * * *